(12) United States Patent
Hamilton et al.

(10) Patent No.: US 8,503,183 B2
(45) Date of Patent: Aug. 6, 2013

(54) INPUT/OUTPUT MODULE FOR BUILDING AUTOMATION SYSTEM WITH MOUNTING PLATE

(75) Inventors: Steve R. Hamilton, Waukegan, IL (US); Michael B. Strozewski, Chicago, IL (US); Jian Fang Wang, Beijing (CN); Yuan Zhang, Beijing (CN)

(73) Assignee: Siemens Industry, Inc., Alpharetta, GA (US)

( * ) Notice: Subject to any disclaimer, the term of this patent is extended or adjusted under 35 U.S.C. 154(b) by 167 days.

(21) Appl. No.: 13/030,489

(22) Filed: Feb. 18, 2011

(65) Prior Publication Data

US 2011/0226506 A1    Sep. 22, 2011

Related U.S. Application Data

(63) Continuation of application No. PCT/US2009/054556, filed on Aug. 21, 2009, and a continuation of application No. 12/543,970, filed on Aug. 19, 2009, now abandoned.

(60) Provisional application No. 61/090,721, filed on Aug. 21, 2008.

(51) Int. Cl.
*H05K 7/00* (2006.01)

(52) U.S. Cl.
USPC ............ 361/728; 361/142; 361/756; 174/53; 174/50; 174/58; 174/55

(58) Field of Classification Search
USPC ............................ 361/728, 142, 756; 174/55
See application file for complete search history.

(56) References Cited

U.S. PATENT DOCUMENTS

| | | | |
|---|---|---|---|
| 4,247,840 A * | 1/1981 | Cooper et al. | 335/18 |
| 4,267,966 A | 5/1981 | Neel | |
| 4,733,330 A * | 3/1988 | Tanaka et al. | 361/641 |
| 5,592,989 A | 1/1997 | Lynn | |
| 6,274,809 B1 * | 8/2001 | Pudims et al. | 174/486 |
| 6,911,598 B2 * | 6/2005 | Onizuka et al. | 174/50 |
| 2002/0146207 A1 * | 10/2002 | Chu | 385/53 |
| 2005/0095927 A1 * | 5/2005 | Conway | 439/843 |
| 2005/0099257 A1 * | 5/2005 | Holce et al. | 336/90 |
| 2006/0039125 A1 | 2/2006 | Jornod | |
| 2008/0151458 A1 | 6/2008 | Beland | |

* cited by examiner

*Primary Examiner* — Tuan T Dinh
*Assistant Examiner* — Steven Sawyer

(57) ABSTRACT

An input/output module for a building automation system includes a mounting plate, a circuit board, and a cover. The mounting plate has at least two fastener receptacles (24-30) positioned to align with fastener receptacles of a standard electrical junction box (90). The mounting plate further includes at least two openings, each opening sized to receive one or more wires therethrough. The circuit board supports an interface circuit configured to communicate on a building network. The circuit board also includes device input terminals and device output terminals. The interface circuit is configured to provide an interface between the building network and devices connected to the input and output terminals. The circuit board is configured to be mounted to the mounting plate. The cover is sized to fit over the mounting plate and circuit board.

19 Claims, 6 Drawing Sheets

INPUT/OUTPUT MODULE FOR BUILDING AUTOMATION SYSTEM WITH MOUNTING PLATE

CROSS-REFERENCE TO RELATED APPLICATIONS

This application is a continuation of PCT Patent Application No. PCT/US2009/054556, filed Aug. 21, 2009, which claims the benefit of U.S. Provisional Patent Application Ser. No. 61/090,721, filed Aug. 21, 2008, and U.S. patent application Ser. No. 12/543,970, filed Aug. 19, 2009, each of which are incorporated herein by reference in their entirety.

FIELD OF THE INVENTION

The present invention relates generally to input/output devices for a building automation system.

Background

Building automation systems include systems that provide automatic monitoring and control over various building operations. Common building automation systems include heating, ventilation and air conditioning (HVAC) systems, security systems, and fire safety systems. While various building automation systems serve different purposes, many share the commonality of employing widely dispersed devices that perform sensing, control and physical (i.e. actuator) operations. For example, an HVAC system typically includes temperature sensors dispersed throughout a building or campus, and also includes ventilation dampers that are dispersed throughout a building. The HVAC system operates the ventilation dampers to increase or decrease the flow of conditioned air (chilled or heated) to different spaces used on the temperature measurements performed in those spaces. The HVAC system typically also includes many dispersed control devices that receive local sensor signals and provide control signals to local dampers based on the control signals. A typical HVAC system can include hundreds of controllers, actuators, and sensors located throughout a building. Security systems and fire safely systems have a similar architecture.

Most building automation systems include a communication network by which various devices (e.g. controllers) can communicate. Building systems also typically include one or more work stations or other access devices whereby a technician or building manager may monitor conditions in the building as detected by the various sensors, and to command devices and/or define controller set points (e.g. desired room temperature, etc.).

In commonly known architectures, individual sensor and actuator devices are not always connected directly to the building automation system communication network. To this end, sensor and actuator devices often include relatively simple analog or digital inputs and outputs, and do not include the sophisticated circuitry that can be required to operate as addressable devices on a data network. To accommodate these devices, building automation systems often provide network connection to controller devices within so-called field control panels. These field control panels include, in addition to controllers, the analog and/or digital I/O circuitry to interact with the non-networked sensors and actuators. While controller devices typically perform localized control using the I/O circuitry, the control field panel circuitry can also provide wider building network access to data received from the sensors via the I/O ports, and to actuators via the FO ports. Accordingly, the field control panel can serve as a sort of interface between a data network and various sensor and actuator hardware.

However, in some cases, sensors and/or actuators can be located at a relatively significant distance from the nearest field control panel. In such cases, it is known in the art to provide an input/output module that connects to sensors and actuators, but does not have the full field panel capability. Such an input/output module operates as an interface between the building network and the end devices (sensors and actuators). The input/output module receives sensor data from the sensors and causes the sensor data to be transmitted to other devices via the building network. Similarly, the input/output module can receive command data from the building network and generate corresponding outputs for the connected sensors and/or actuators. Such input/output modules have various shapes and custom mounting methods.

A problem with all building automation systems is the cost associated with wiring the system. Because the system employs devices dispersed throughout an entire building, the material and installation cost of the wiring can be significant. The use of wireless sensors and actuators has been proposed, and shows promise as a solution. However, the complete elimination of wired sensors in building automation systems on a wide scale basis does not appear to be imminent. Accordingly, there is always a need to reduce the cost associated with wiring building automation systems without implementing wireless solutions.

SUMMARY OF THE INVENTION

The present invention addresses the above described needs, as well as others, by providing an input/output module that may be mounted to a standard electrical junction box, such as the type installed for installing light switches and electrical outlets.

In a first embodiment, an input/output module for a building automation system includes a mounting plate, a circuit board, and a cover. The mounting plate has at least two fastener receptacles positioned to align with fastener receptacles of a standard electrical junction box. The mounting plate further includes at least two openings, each opening sized to receive one or more wires therethrough. The circuit board supports an interface circuit configured to communicate on a building network. The circuit board also includes device input terminals and device output terminals. The interface circuit is configured to provide an interface between the building network and devices connected to the input and output terminals. The circuit board is configured to be mounted to the mounting plate. The cover is sized to fit over the mounting plate and circuit board.

The above-described features and advantages, as well as others, will become more readily apparent to those of ordinary skill in the art by reference to the following detailed description and accompanying drawings.

DETAILED DESCRIPTION

Figure 1:
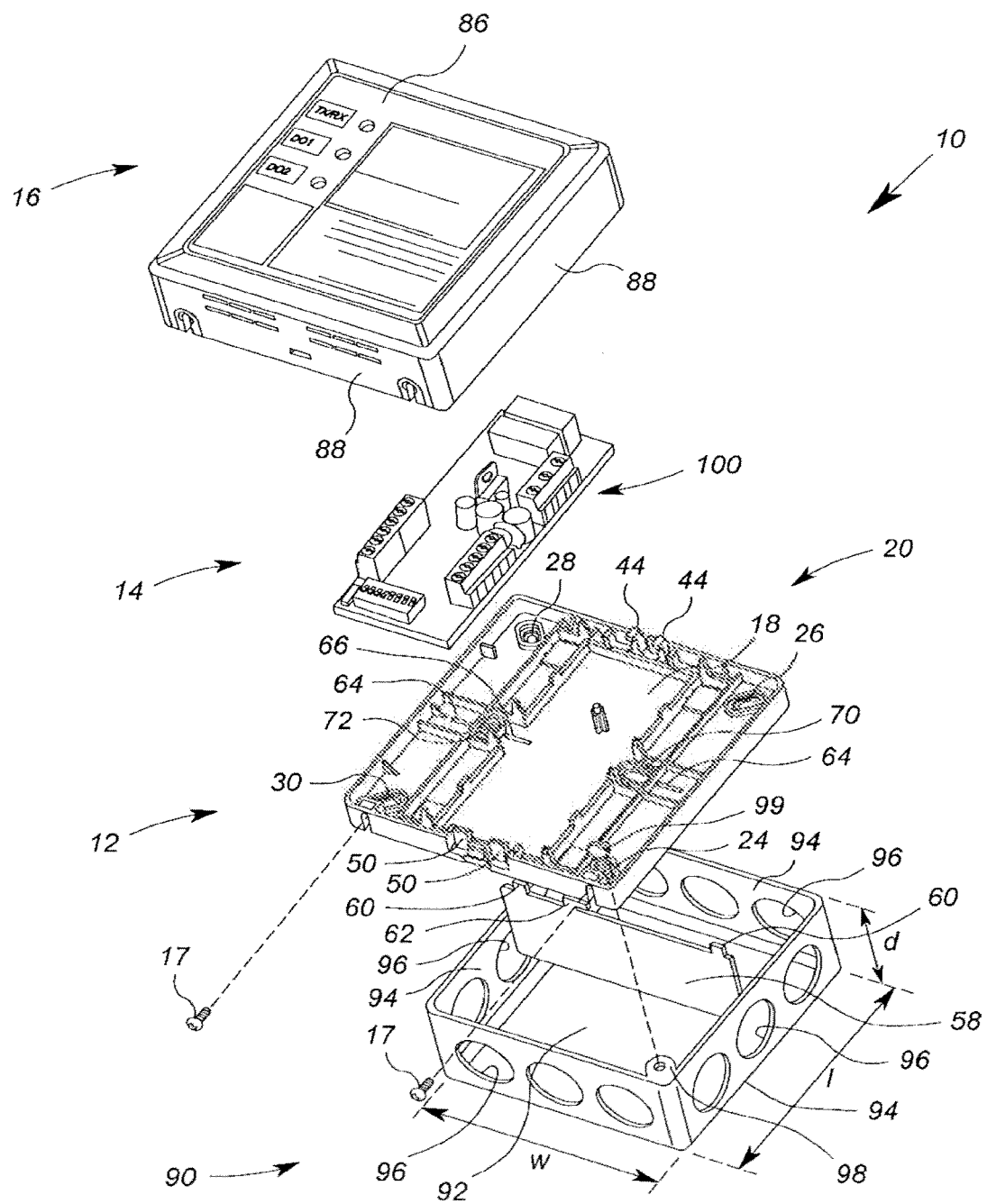
FIG. 1 shows an exploded perspective view of an exemplary input/output module according to an embodiment of the invention as well as a standard electrical junction box to which it can be mounted.
Figure 2:
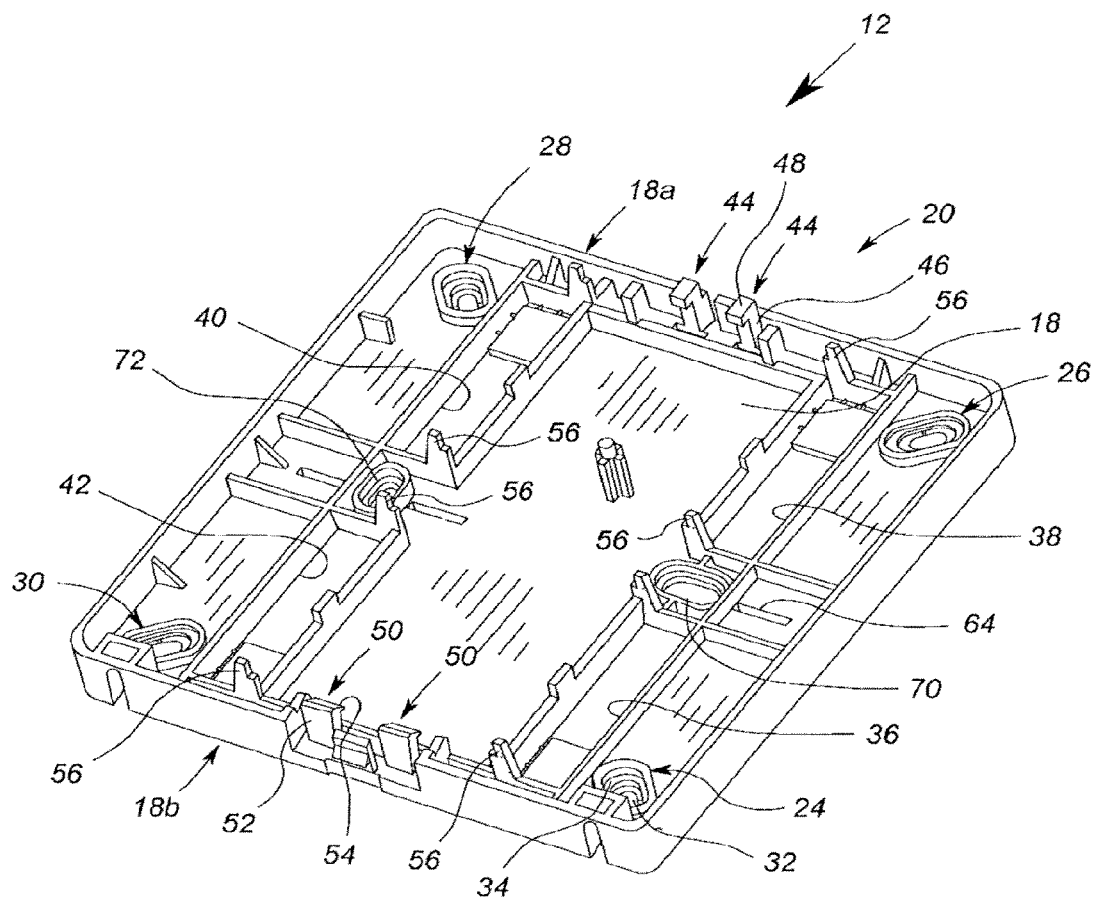
FIG. 2 shows a first perspective view of a first side of the mounting plate of the input/output module of FIG. 1.
Figure 3:
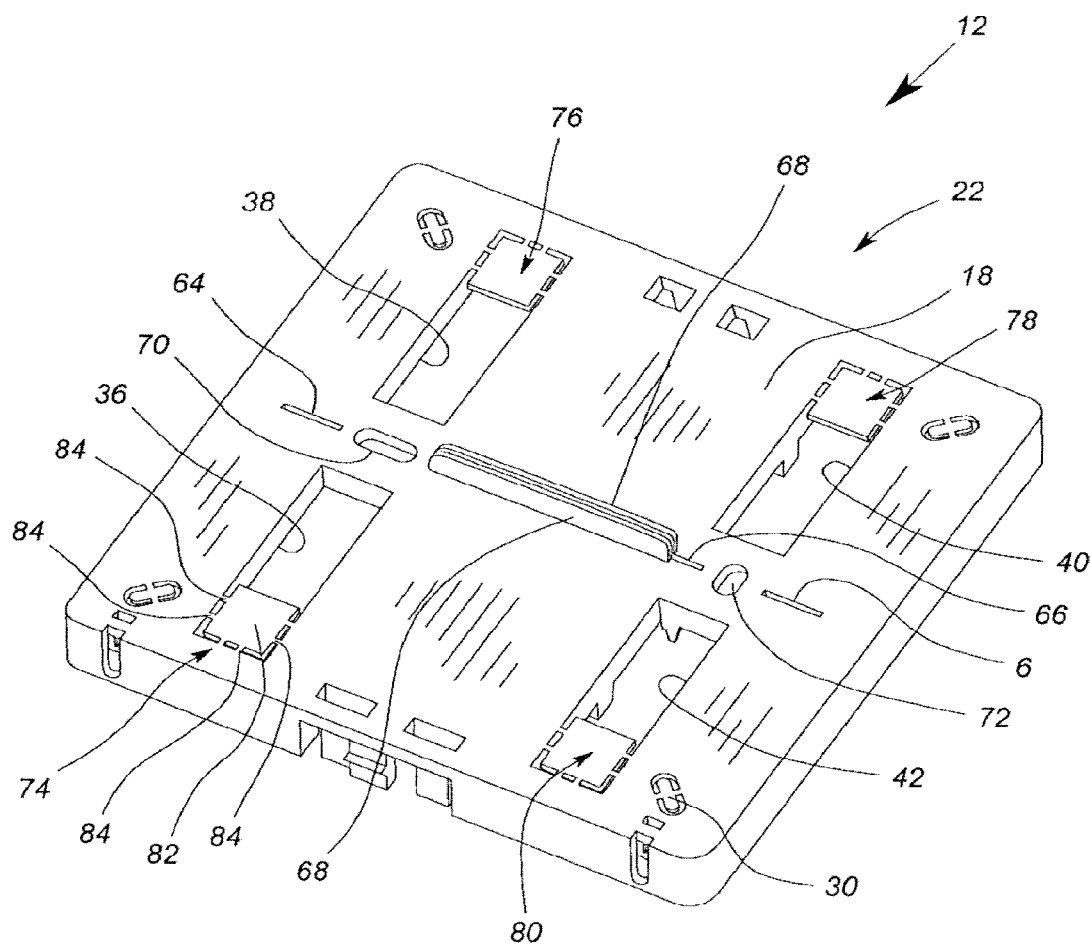
FIG. 3 shows a first perspective view of a second side of the mounting plate of the input/output module of FIG. 1.
Figure 4:
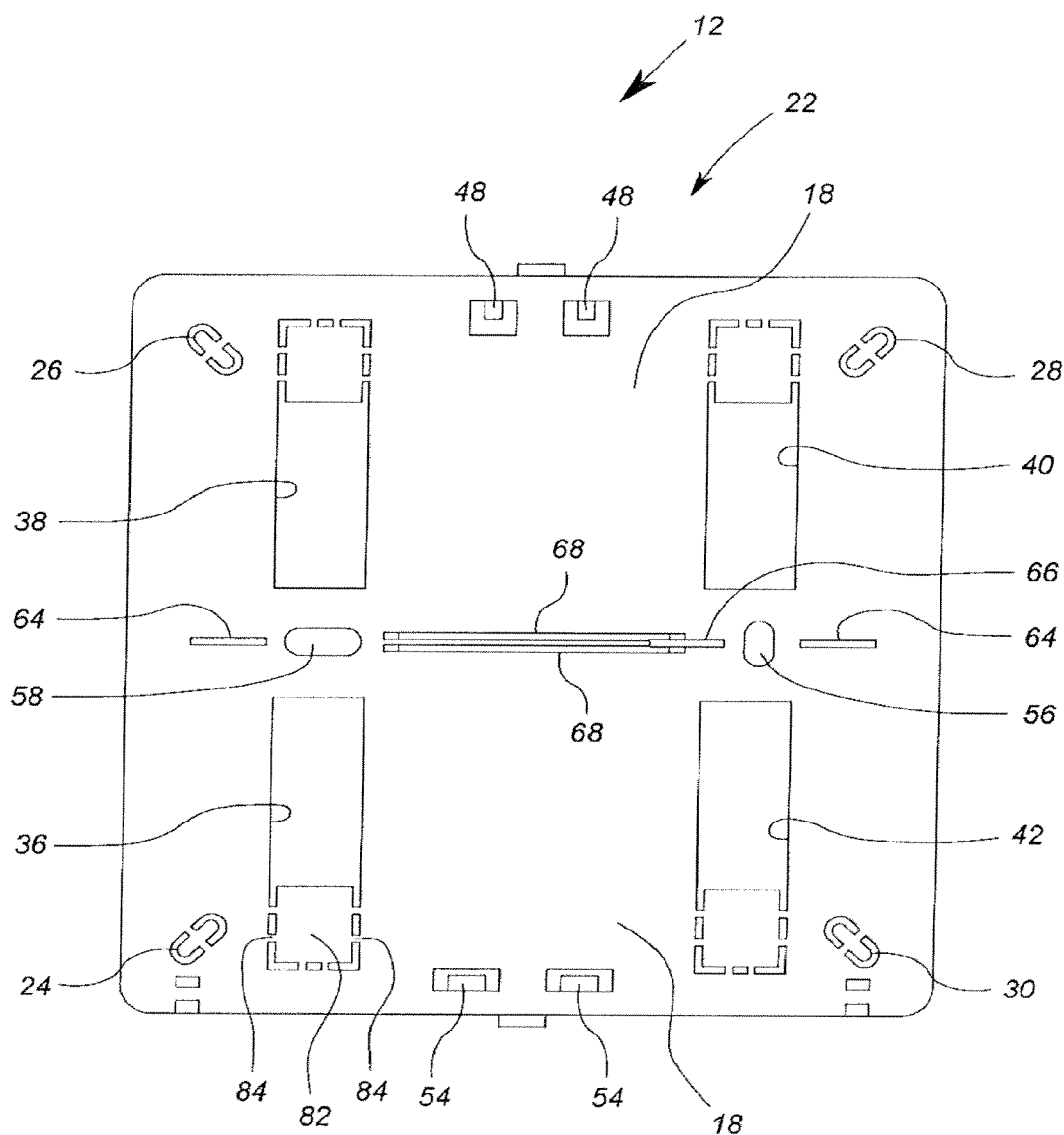
FIG. 4 shows a plan view of the second side of the mounting plate of FIGS. 2 and 3.
Figure 5:
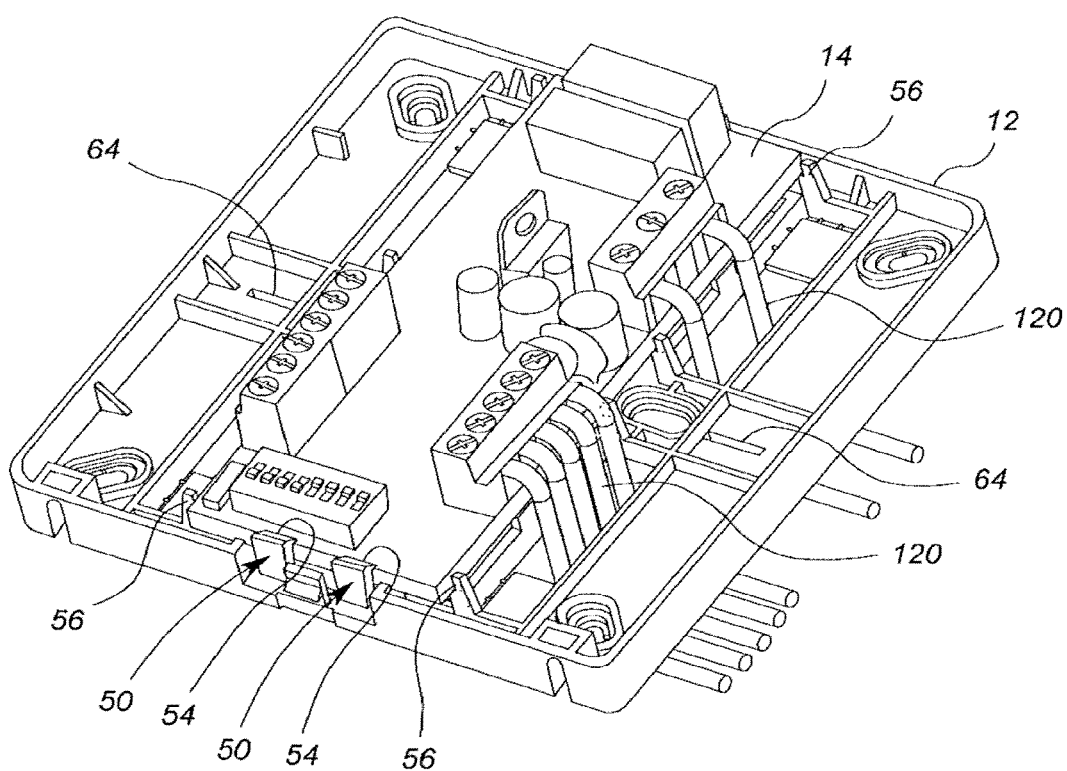
FIG. 5 shows a perspective view of the mounting plate and circuit board of the input/output module of FIG. 1 with wires connected to at least some of the wiring terminals.

FIG. 1 shows an exploded perspective view of an exemplary input/output module 10 according to an embodiment of the invention, as well as a standard electrical junction box 90 to which the input/output module 10 can be mounted. The input/output (I/O) module 10 includes a mounting plate 12, a circuit board 14, and a cover 16. FIGS. 2, 3 and 4 show additional views of the mounting plate 12, and FIG. 5 shows a perspective view of the mounting plate 12 and circuit board 14 of the input/output module of FIG. 1 with wires 120 connected to at least some of the wiring terminals. Reference to the various views is made throughout the description.

The electrical junction box 90 is a standard junction box used in wiring residential, commercial and industrial buildings, and is typically associated with the use of an electrical system within a building. For example, the electrical junction box is a standard four-inch square junction box typically used in building wiring in the United States. The junction box 90 is in the form of an open metal or plastic box, having a back wall 92 and four side walls 94. The side walls each include a plurality of openings 96 for passing wires into and out of the junction box 90. The junction box 90 further includes a screw boss 98 in a corner defined by two sides 94 of the junction box 94, and a second screw boss, not shown, disposed on an opposing corner of the other two sides 94. The screw boss 98 extends from the level of the top edge of the side walls 94 down along at least part of the depth of the junction box 90. The electrical junction box 90 has a length/and width w defined generally the back wall 92, and a depth d defined by the side walls 94. In general, the length/and the width w are on the order of 95 mm to 100 mm.

While some variation of the electrical junction box 90 will occur, the position of the screw boss 98 and opposing screw boss are defined by standard. In addition, as will be discussed further below, the I/O module 10 may be used in connection with another electrical junction box, not shown, that is the defined standard in other countries. Such other electrical junction boxes are defined, for example, by IEC 60634.

The mounting plate 12 includes a plate-like support structure 18 that has a first side 20 (see FIGS. 1 and 2) and a second side 22 (see FIGS. 3 and 4). The mounting plate 12 has four fastener receptacles 24, 26, 28, 30, opposing pairs of which are positioned to align with fastener receptacles of a standard electrical junction box, in other words, proximate opposing corners of a square measuring approximate 100 mm×100 mm. Thus, for example, the fastener receptacles 24 and 28 align with the screw boss 98 and the opposing screw boss, not shown, of the junction box 90. Moreover, if the FO module 10 or the junction box 90 were rotated by ninety degrees, then the fastener receptacles 26 and 30 would align with the screw boss 98 and the opposing screw boss. In either case, the fastener receptacles 24, 26, 28 and 30 are positioned such that the plate-like support structure 18 substantially extends at least to the side walls 96 of the junction box 90 when opposing pairs of the receptacles 24, 26, 28 and 30 are aligned with the screw boss 98 and the opposing screw boss.

As shown in FIG. 2, the fastener receptacle 24 includes a through-hole 32 defined as an oval that is oriented diagonally toward the center of the support structure 18. The fastener receptacle 24 also includes a raised boss structure 34 surrounding the through-hole 32. Each of the fastener receptacles 26, 28 and 30 has a substantially identical structure. The oval shape and orientation of the through-hole 32 and corresponding boss structure 34 allows for a margin of error in the configuration of the fastener receptacles 98 of the junction box 90. Accordingly, the mounting plate 10 is configured to be affixed to a wide range of tolerances in the standard junction box configuration.

The mounting plate 12 further includes at least two openings, and in this embodiment, four openings 36, 38, 40 and 42, defined through the support structure 18. Each of the four openings 36, 38, 40 and 42 is sized to receive multiple wires and/or cabling therethrough. In this embodiment, each of the openings 36, 38, 40 and 42 is rectangular in shape. (See also FIGS. 3, 4)

Figure 6:
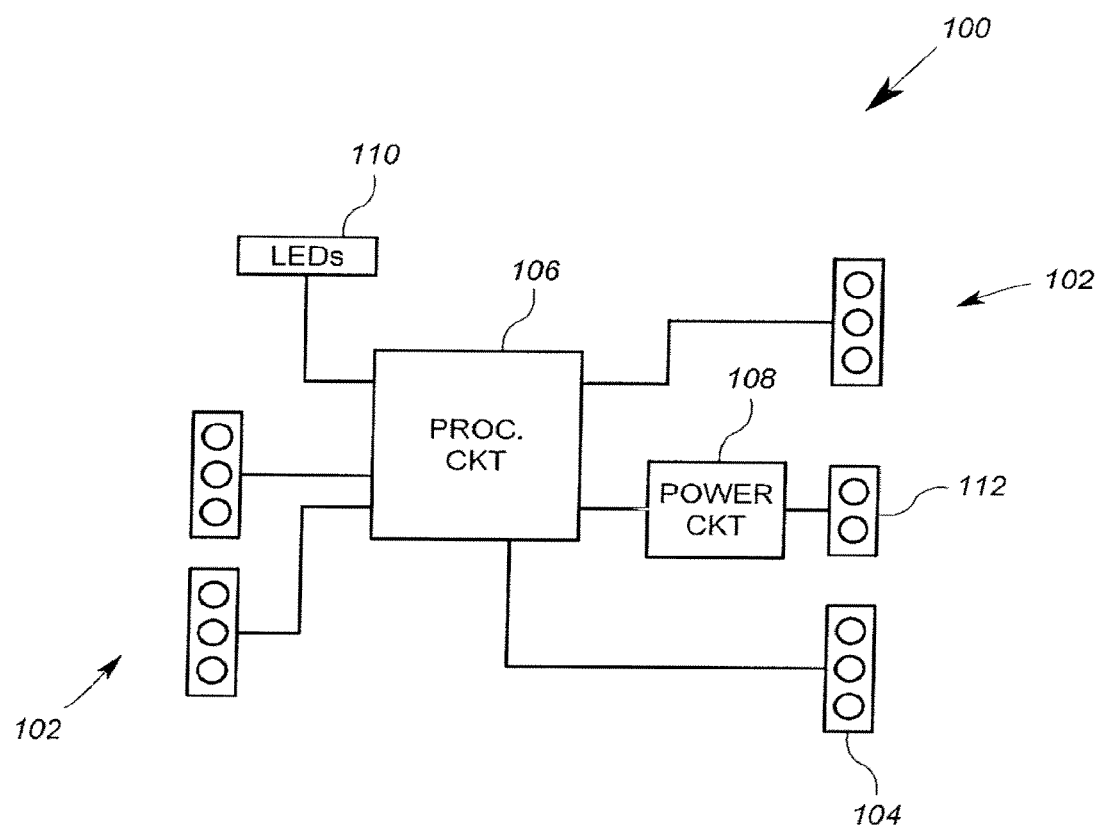
FIG. 6 shows a schematic diagram of the interface circuit disposed on the circuit board of the input/output module of FIG. 1.

Referring again to the embodiment of FIG. 1, the circuit board 14 is a circuit board that has dimensions that are generally configured to fit within the length and width of the junction box 90. In other words, the circuit board 14 has a length less than/and a width less than w. The circuit board 14 supports an interface circuit 100, shown in schematic form in FIG. 6. The interface circuit 100 includes a plurality of input and output (I/O) terminals 102, communication terminals 104, a processing circuit 106, a power regulation circuit 108, a plurality of indicators 110, and power input terminals 112.

The I/O terminals 102 include digital input terminals, digital output terminals, analog input terminals, and analog output terminals. The processing circuit 106 includes a programmable processor as well as other circuitry configured to interface electrically with the I/O terminals 102. Such circuits are known in the art. The different types of I/O terminals 102 allow for flexible usage of the I/O module 10 in different applications.

The communication terminals 104 are configured to connect to a communication network, not shown, such as a building control network. The power input terminals 112 are configured to be coupled to a power source, such as 24 volt AC building power conductors. The power regulation circuit 108 is configured to generate regulated DC bias voltages for the processing circuit 106 and any other circuits requiring power in the interface circuit 100.

The processing circuit 106 is configured through software or firmware to respond to requests from a communication network for data relating to physical devices, not shown, connected to the FO terminals 102. For example, processing circuit 106 can receive a request for temperature data from a sensor, not shown, which is connected to the one of the input terminals 102. The processing circuit 106 is further configured to read the voltage at the input terminal 102, which is representative of the voltage sensed by the sensor. The processing circuit 106 is also configured to generate a data message that includes information representative of the measured temperature, the data message having the appropriate communication network protocol format. The processing circuit 106 is further configured to cause communication of the data message on the network via the communication network terminals 104. The processing circuit 106 may include or be connected to an address setting device, such as a dip switch, which defines the network address for the module 10.

The processing circuit 106 is further configured through software or firmware to communicate commands to the FO terminals 102, where the commands are received from a controller or processor on the communication network. For example, processing circuit 106 can receive a data message on the communication network terminals 104 that includes a command to operate an actuator that is connected to one of the outputs 102. The actuator may suitably be an actuator for a water valve or ventilation damper. The processing circuit 106 is configured to generate the command in the format expected by the actuator, and provide the generated command to the appropriate output terminal 102.

Thus, the processing circuit 106 operates as an interface between the communication network connected to the communication terminals 104 and the physical devices connected to the I/O terminals 102. In some embodiments, the processing circuit 106 may further be configured to perform control operations. For example, the processing circuit 106 may be configured to command an actuator connected to one of the output terminals 102 based on temperature or other sensor information received from one or more of the inputs 102. In such a case, the processing circuit 106 would execute a control algorithm, such as a PID control algorithm, to generate control signals (for the outputs 102) based on process signals (from the inputs 102) in accordance with a set point (from the communication terminals 104).

Referring again to FIG. 1, and also referring to FIGS. 2 and 5, circuit board 14 is configured to be installed onto the mounting plate 12 using physical features of the mounting plate 12. In particular, the mounting plate 12 includes L-shaped interference features 44 disposed proximate a first end 18*a* of the support structure 18. Each L-shaped feature 44 includes a shaft 46 extending upward from the support structure 18 and an inward extension 48 proximate the top of the shaft 46. The inward extension 48 extends toward the second side 18*b* of the support structure 18, such that the inward extension and shaft 46 receive and retain a first edge of the circuit board 14. In addition, retention barbs 50 are disposed proximate the second end 18*b* of the support structure 18. Each retention barb 50 includes a shaft 52 and an angled barb element 54. The shaft 52 extends upward from the support structure 18 and the barb element 54 extends toward the first side 18*a* of the support structure 18. The barb element 54 is angled downward, which facilitates a snap-fit installation of the circuit board 14. The retention barbs 50 retain a second edge of the circuit board 14.

Thus, the L-shaped features 44 and the retention barbs 50 retain the circuit board 14 from movement outward in the direction of the first side 18*a* of the support structure 18, the second side 18*b* of the support structure 18, as well as upward from the support structure 18. The support structure 18 also includes framing posts or ribs 56 that inhibit movement in the direction normal to the direction from the first side 18*a* and the second side 18*b*.

Accordingly, the features 44, 50 and 56 are configured to receive and retain the circuit board 14 in the position shown in FIG. 5. In this embodiment, circuit board 14, when installed, does not overlap the fastener receptacles 24, 26, 28 and 30. Such a configuration allows for flexible installation order of the mounting plate 12 in the junction box 90 and the circuit board 14 in the mounting plate 12. In other words, the installer may readily install the circuit board 14 prior to installing the mounting plate 12 in the junction box 12, or vice versa. In addition, in this embodiment, the circuit board 14 also does not completely overlap any of the openings 36, 38, 40 and 42. Such a configuration facilitates wiring by limiting the number of wire bends, and allows for connection of wires 120 (see FIG. 5) either before or after the installation of the circuit board 14.

Referring to the cover 16, the cover 16 comprises a top plate 86 and a plurality of side panels 88. An end of each of the side panels 88 is disposed adjacent an edge of the mounting plate 12.

In a typical use of the I/O module 10, an installer runs the wires 120 to be connected to the I/O module 10 through the openings 96 of the junction box 90. In many cases, the wires 120 will be ran to the junction box 90 and through the openings 96 by a building electrician. Another installer then, at a subsequent time, runs the wires 120 through the appropriate openings 36, 38, 40 and 42 of the mounting plate 12, and connects the wires to the appropriate ones of the communication terminals 104 and I/O terminals 106. The installer then affixes the circuit board 14 to the mounting plate 12. To this end, the installer places a first edge of the circuit board 14 under the inward extension 48 and against the shaft 46 of the interference features 44, and generally aligns the circuit board 44 between the rib/post features 56. The installer then pushes the second end over the barbs 50 until the second end clears barb elements 54, snapping into place below barb elements 54.

The installer then aligns the mounting plate 12 such that one of the opposing pairs of the fastener receptacles 24, 26, 28 and 30 line up with the boss 98 and the opposing boss, not shown in FIG. 1, of the junction box 90. Once aligned, the installer affixes the mounting plate 12 to the junction box by inserting fasteners (e.g. fastener 99) through the aligned receptacles and bosses (e.g. receptacle 24 and boss 98). After the mounting plate 12 has been installed, the cover 16 is disposed over the mounting plate 12 and attached via additional fasteners, for example, fasteners 17.

In the embodiment described above, the I/O module 10 further includes an optional barrier 58 that extends from the second side 22 of the mounting plate 12 into the interior the junction box 12. In particular, it can be advantageous to install a barrier between different types of conductors within the junction box. The barrier can provide separation between low voltage and high voltage conductors, if desired. As shown in FIG. 1, the barrier 58 is configured as a generally rectangular plate-like structure having two alignment features 60 and an L-shaped retention element 62. Correspondingly, mounting plate 12 includes slots 64 for receiving the alignment features 60 and a slot 66 for receiving the retention element 62. The mounting plate 12 further includes two parallel ribs 68 configured to receive a part of the edge of the barrier 58 and retain the edge in a friction-fit manner. The barrier 58 is configured to generally extend through the width w and/or length/of the junction box 90, thereby dividing the interior of the junction box 90 into two substantially physically isolated compartments.

Another optional feature shown in the embodiment of FIGS. 1-5 is an adaptation for standard European-style junction boxes. To this end, the mounting plate 12 further includes two additional fastener receptacles 70, 72 disposed on the support structure 18 in a position compatible with the wiring standard IEC 60634 for European electrical junction boxes. In general, the fastener receptacle 70 is disposed along the dimension along, the length/approximately at the midpoint of the mounting plate 12, and the along the dimension along the width w approximately one-quarter of the width away from one side of the mounting plate 12. Similarly, the fastener receptacle 72 is disposed along the dimension along the length/approximately at the midpoint of the mounting plate 12, and the along the dimension along the width w approximately one-quarter of the width away from the other side of the mounting plate 12. The fastener receptacle 70 has an oval-shaped through-hole and surrounding boss, with the long dimension of the oval extending parallel to the dimension along the length/. Similarly, the fastener receptacle 72 has an oval-shaped through-hole and surrounding boss. However, the long dimension of the oval of the receptacle 72 extends parallel to the dimension along the width w.

Another feature of the embodiment of FIGS. 1-5 is expandability of the openings 36, 38, 40 and 42 of the mounting plate 12. In particular, as shown in FIGS. 3 and 4, adjacent each of the openings 36, 38, 40 and 42 are respective punch tabs 74, 76, 78 and 80. By way of example, the punch tab 36 includes a plate 82 and connectors 84. The plate 82 is slightly smaller than the width of the opening 36, and is less than one-half the length (on the order of one-third the length) of the opening 36. The plate 82 is disposed at one end of the opening, and is coupled to the support structure 18 via the connectors 84. The connectors 84 are configured to hold the plate 82 in place on the support structure, but also define a weak point that allows forcible removal of the plate 82. The support structure 18 is shaped such that, when the plate 82 is forcibly removed via failure of the connectors 84, the effective size of the opening 36 increases by approximately the size of the plate 82. The punch tabs 76, 78 and 80 have substantially the same configuration.

The punch tabs 74, 76, 78 and 80 provide additional flexibility to increase the size of the openings 36, 38, 40 and 42 in the event that such an increase is necessary. In addition, in the event that an increase is not necessary, the punch tabs 74, 76, 78 and 80 effectively cover open areas where access to dangerous electrical conductors can occur.

It will further appreciated that the fastener openings 24, 26, 30 and 32 can include punch tabs as shown in FIG. 3, which can be forcibly removed if and when each opening is used.

The above-described embodiment thus includes many features and advantages in flexibility, compatibility and ease of installation that can reduce wiring costs in a building control system. One feature of many embodiments is the ability to employ standard electrical junction boxes as a connection point, which is differs from the typical building automation system installation. This feature facilitates separation of the wall wiring activities and the I/O module wiring activities. Another feature is the adaptability of at least some embodiments of the I/O module to different junction box styles and tolerances.

It will be appreciated that the above-described embodiments are merely exemplary, and that those of ordinary skill in the art may readily devise their own implementations and modifications that incorporate the principles of the invention and fall within the spirit and scope thereof.

We claim:

1. An input/output module for building automation system, comprising: a mounting plate having at least two fastener receptacles positioned to align with fastener receptacles of a standard electrical junction box, the mounting plate further comprising at least two openings, each opening sized to receive one or more wires therethrough; a circuit board supporting an interface circuit, the interface circuit configured to communicate on a building network, and including at least one device input terminal and one device output terminal, the interface circuit configured to provide an interface between the building network and one or more devices connected to the input and/or output terminals, the circuit board mounted to the mounting plate; and a cover sized to fit over the mounting plate and circuit board; and wherein at least a portion of each opening extends past at least one edge of the circuit board in a plane defined by a main surface of the mounting plate when the circuit board is mounted to the mounting plate; wherein each opening is disposed adjacent to a location on the circuit board that includes at least one of the input and/or output terminals.

2. The input/output module of claim 1, wherein the circuit board supports a plurality of input device terminals and a plurality of output device terminals.

3. The input/output module of claim 1, wherein the cover comprises a top plate and a plurality of side panels, and wherein an end of each of the side panels is disposed adjacent an edge of the mounting plate.

4. The input/output module of claim 1, wherein the at least two fastener receptacles comprise four fastener receptacles disposed to define corners of a square.

5. The input/output module of claim 1, further comprising additional fastener receptacles positioned to align with fastener receptacles of a second standard electrical junction box, a configuration of the fastener receptacles of the second standard electrical junction box different than a configuration of the fastener receptacles of the standard electrical junction box.

6. The input/output module of claim 1 wherein at least a portion of each opening extends past at least one edge of the circuit board in a plane defined by a main surface of the mounting plate when the circuit board is mounted to the mounting plate.

7. The input/output module of claim 1, wherein the circuit board lies in a plane parallel to the plane defined by the main surface of the mounting plate.

8. The input/output module of claim 6, wherein the mounting plate has a first surface and a second surface, and wherein the circuit board mounts on or above the first surface, and wherein die second surface faces an interior of the standard electrical junction box when the at least two fastener receptacles are aligned with fastener receptacles of the standard electrical junction.

9. The input/output module of claim 8, further comprising a barrier element, the barrier element received by the mounting plate and extending in a direction away from the second surface, the barrier element disposed at least partly between two of the at least two openings.

10. The input/output module of claim 9, wherein the at least two fastener receptacles comprise four fastener receptacles disposed to define corners of a square.

11. The input/output module of claim 10, further comprising additional fastener receptacles positioned to align with fastener receptacles of a second standard electrical junction box, a configuration of the fastener receptacles of the second standard electrical junction box different than a configuration of the fastener receptacles of the standard electrical, unction box.

12. The input/output module of claim 11, further comprising further comprising a punch tab disposed adjacent to a first of the at least two openings, the punch tab including a removable plate configured to enlarge the first opening.

13. An input/output module for a building automation system, comprising:
a mounting plate having at least two fastener receptacles positioned to align with fastener receptacles of a standard electrical junction box, the mounting plate further comprising at least two openings, each opening sized to receive one or more wires therethrough;
a circuit board supporting an interface circuit, the interface circuit configured to communicate on a building network, and including at least one device input terminal and one device output terminal, the interface circuit configured to provide an interface between the building network and one or more devices connected to the input and/or output terminals, the circuit board mounted to the mounting plate; and a cover sized to fit over the mounting plate and circuit board; and wherein the mounting plate has a first surface and a second surface, and wherein the circuit board is mounted on or above the first surface, and wherein the second surface faces an interior of the standard electrical junction box when the at least two fastener receptacles are aligned with fastener receptacles of the standard electrical junction box.

14. The input/output module of claim 13, further comprising a barrier element, the barrier element received by the mounting plate and to extending in a direction away from the second surface, the barrier element disposed at least partly between two of the at least two openings.

15. The input/output module of claim 13, wherein the openings are defined in the first surface and the second surface.

16. The input/output module of claim 13, wherein the at least one device input terminal comprises an analog input terminal.

17. The input/output module of claim 15, wherein at least a portion of each opening extends past at least one edge of the circuit board in a plane defined by a main surface of the mounting plate when the circuit board is mounted to the mounting plate.

18. The input/output module of claim 16, wherein the interface circuit further comprises a processing circuit configured to read a voltage on the analog input terminal.

19. An input/output module for a building automation system comprising: a mounting plate having at least two fastener receptacles positioned to align with fastener receptacles of a standard electrical junction box, the mounting plate further comprising at least two openings, each opening sized to receive one or more wires therethrough; a circuit board supporting an interface circuit, the interface circuit configured to communicate on a building network, and including at least one device input terminal and one device output terminal, the interface circuit configured to provide an interface between the building network and one or more devices connected to the input and/or output terminals, the circuit board mounted to the mounting plate; and a cover sized to fit over the mounting plate and circuit board; and a punch tab disposed adjacent to a first of the at least two openings, the punch tab including a removable plate to enlarge the first opening when removed; wherein each opening is, disposed adjacent to a location on the circuit board that includes at least one of the input and/or output terminals.

* * * * *